United States Patent [19]

Nakata et al.

[11] Patent Number: 5,066,974
[45] Date of Patent: Nov. 19, 1991

[54] AUXILIARY EXPOSURE DEVICE FOR IMAGE RECORDING APPARATUS

[75] Inventors: Takashi Nakata; Tauyoshi Suzuki, both of Nagoya, Japan

[73] Assignee: Brother Kogyo Kabushiki Kaisha, Nagoya, Japan

[21] Appl. No.: 615,804

[22] Filed: Nov. 19, 1990

[30] Foreign Application Priority Data

Jan. 19, 1990 [JP] Japan ............................... 2-4213[U]

[51] Int. Cl.$^5$ .............................................. G03B 27/72
[52] U.S. Cl. ......................................... 355/71; 355/55; 355/230; 355/243
[58] Field of Search ..................... 355/71, 18, 66, 67, 355/55, 32, 35, 230, 243; 346/107 R

[56] References Cited

U.S. PATENT DOCUMENTS

| | | |
|---|---|---|
| 4,593,996 | 6/1986 | Kubono et al. ........................ 355/71 |
| 4,924,255 | 5/1990 | Horaguchi et al. .................... 355/27 |
| 4,933,685 | 6/1990 | Asano et al. .......................... 346/1.1 |

FOREIGN PATENT DOCUMENTS 64-17532 1/1989 Japan .
64-23044 2/1989 Japan .

*Primary Examiner*—R. L. Moses
*Attorney, Agent, or Firm*—Oliff & Berridge

[57] ABSTRACT

An auxiliary exposure device for an image forming apparatus which forms an image on a recording medium using slit-scanning exposure. The auxiliary exposure device comprises a reflection member which is insertable into and removable from a light path extending from a light source to a recording medium, a drive unit for moving the reflection member into and out of the light path, and a control unit for controlling a drive unit to adjust the amount of insertion of the reflection member into the light path. When the image to be copied is based on a photograph or like multi-toned original, requiring auxiliary exposure, the reflection member is inserted into the light path. In this state, when a part of an original image is irradiated by light emitted from a light source, the reflection surface of the reflection member is also irradiated. The light reflected from the original and the reflection surface of the reflection member pass to the photosensitive recording medium through the optical system and the primary exposure and the auxiliary exposure occur simultaneously.

16 Claims, 1 Drawing Sheet

AUXILIARY EXPOSURE DEVICE FOR IMAGE RECORDING APPARATUS

BACKGROUND OF THE INVENTION

1. Field of the Invention

This invention relates to an auxiliary exposure device for use with an image forming apparatus that forms the image on the recording medium by a slit-scanning exposure system.

2. Description of Related Art

An auxiliary exposure device is used for irradiating a secondary light onto a photosensitive recording medium, a photoreceptor or the like when the original image has an intermediate color portion, such as found in a photograph, is to be copied onto the receiving medium by the image forming apparatus. When the copied image is formed by a primary exposing light, irradiated onto the original image through a slit and then reflected to the photosensitive recording, or receiving, medium, the light and shade of the intermediate color portion of the copied image is accentuated (the contrast is accentuated in monochrome copy).

Conversely, if the photosensitive recording medium is exposed to a secondary light source at the same time, the light and shade of the formed image is softened and the tone reproduction or tone gradation is improved. This is especially true for the reproduced images of the middle tones (for instance, gray). These middle tones are output more clearly and approach the tone of the original image, such as a photograph.

Prior art devices addressing this problem normally have a secondary light source, used only for the auxiliary exposure, in addition to the primary light source providing for the main exposure of the original. The secondary light source providing the auxiliary exposure was installed in or near the exposure portion of the image forming apparatus where the photosensitive recording medium is irradiated by the reflected light from the original. The light intensity of the secondary light source irradiated onto the recording medium is usually about 20–30 percent of the amount of light received from the primary light source.

However, in these conventional image forming apparatuses, the color temperature of the secondary light source might be different from that of the primary light source because the primary light source providing the main exposure is different from the secondary light source providing the auxiliary exposure. Therefore, the color of the formed image may be changed from that of the original, that is, the copy has its color image shifted to appear more reddish or bluish. Further, adjusting the amount of exposure by the secondary light source has been very difficult as it usually has been adjusted by changing the voltage applied to the secondary light source. Further, the construction of the device is complicated and results in high manufacturing costs as the primary and secondary source lights are separately installed.

Image forming apparatus that address the abovenoted problems are known. One such image forming apparatus is disclosed in Japanese Utility Model Laid-Open Application No. 64(1989)-17532 (published Jan. 27, 1989). In this image forming apparatus as disclosed, a movable reflection board is provided between a light source and the original image. To form a copy image with this apparatus, the light is irradiated onto the original without simultaneously irradiating the reflection board. Next, the light is irradiated onto the reflection board by placing the reflection board between the light source and the original image. The light reflected by the reflection board has the same effect as an auxiliary exposure in the dual light apparatus. Thus, it is unnecessary to install a secondary light source to be used only for the auxiliary exposure and the problem with the conventional apparatus is solved. However, it is now necessary to have two exposure processes in order to form the image.

A second such image forming apparatus is disclosed in Japanese Utility Model Laid-Open Application No. 64(1989)-23044 (Published Feb. 7, 1989). In this apparatus, a slit-scanning exposure system is used with a reflection board, that reflects a part of the light emitted from the light source, provided between the original image and the slit. When a copy image is formed using this apparatus, both the main exposure and the auxiliary exposure are executed at the same time, because a part of the light from the light source irradiating to the original also irradiates to the reflection board.

With this second image forming apparatus, the image is formed using one exposure process and the problem with the conventional apparatuses is solved. However, the degree of the auxiliary exposure cannot be changed.

SUMMARY OF THE INVENTION

It is therefore an object of the present invention to provide an auxiliary exposure device for an image forming apparatus in which an image of the middle tones, such as found in photographs, is obtained clearly without a color change.

It is another object of the present invention to provide an auxiliary exposure device for an image forming apparatus which has a simple structure and can be manufactured cheaply.

It is still another object of the present invention to provide an auxiliary exposure device for an image forming apparatus in which the degree of tone reproduction can be easily adjusted.

According to the present invention, there is provided an auxiliary exposure device for an image forming apparatus to form an image on a recording medium by moving an original image and a light source relative to one another while irradiating the recording medium with light emitted from the light source and reflected from the original image comprising: a reflection member insertable into and removable from the light path between the light source and the recording medium, wherein the reflection member has a reflection surface for reflecting the light emitted from the light source; driving means for driving the reflection member for insertion or removal from the light path; and control means for controlling the drive means and adjusting the amount of insertion of the reflection member into the light path.

According to the image forming apparatus having the auxiliary exposure device of this invention described above, when the original image is based on a photograph, or similar variable tone image, requires an auxiliary exposure to accurately reproduce the image, the reflection member is inserted into the light path from the light source to the recording medium. Thus, when the original image is irradiated by the light source, the reflection surface of the reflection member is also irradiated. Therefore, light reflected by both the original image and the reflection surface of the reflection member is irradiated to the photosensitive recording, or receiving, medium through the optical system and the main exposure and the auxiliary exposure are executed at the same time. As a result, the portion having middle tones, such as found in photographs, is clearly formed with accurate tone reproduction. Furthermore, the degree of the tone reproduction can be adjusted as the occasion demands.

Because of the auxiliary exposure device of this invention, it is unnecessary to have the secondary light source which was required in many of the conventional devices. Further, it is possible to produce the auxiliary exposure device inexpensively with a simple structure that produces the desired copy having a clear image and accurate tone reproduction without a color change.

BRIEF DESCRIPTION OF THE DRAWINGS

The above and other objects, features and advantages of the present invention will become more apparent from the following description of the invention taken in connection with drawings, in which.

DETAILED DESCRIPTION OF THE PREFERRED EMBODIMENT

The invention is explained with reference to the drawings with initial reference to FIG. 1.

Figure 1:
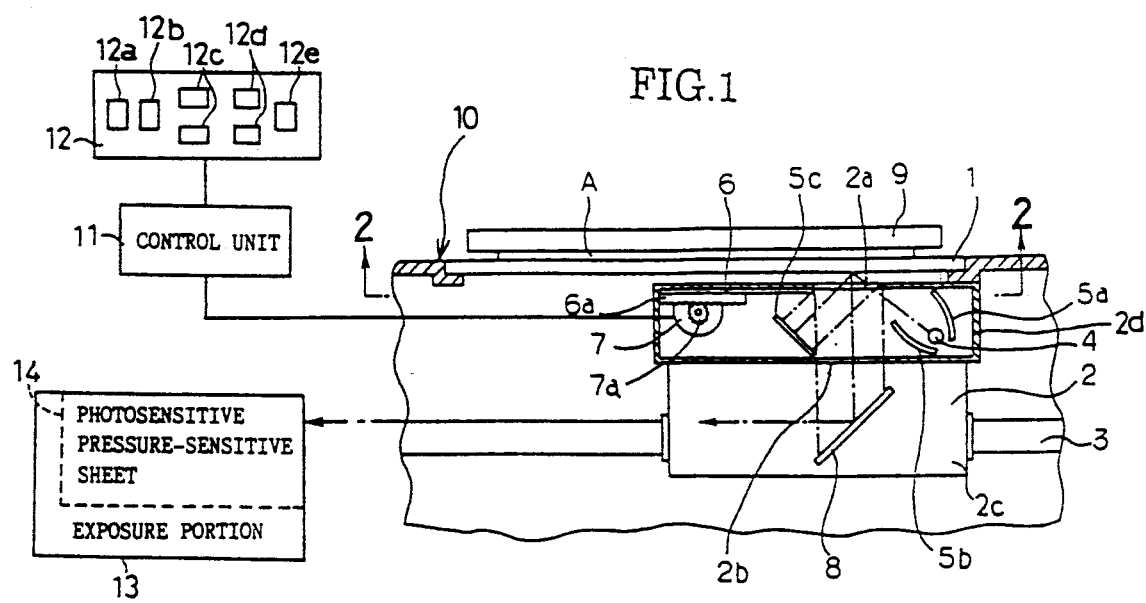
FIG. 1 is a partial cross-sectional view showing an image forming apparatus having the auxiliary exposure device of the invention.

As shown in FIG. 1, contact glass 1 forms the main part of the original image support stand of image forming apparatus 10. In image forming apparatus 10, guide bar 3 is arranged parallel to the longitudinal axis of contact glass 1. Located beneath contact glass 1 is lamp housing unit 2 for irradiating the original A. Lamp housing unit 2 is supported slidably by guide bar 3 and comprises a base part 2c and a box part 2d supported by the base part 2c. Upper slit 2a is formed in the upper surface of box part 2d. Installed in box part 2d are a linearly-shaped halogen lamp 4, a couple of semicylindrical reflectors 5a, 5b disposed to surround the back of lamp 4, and a flat reflector 5c. In the bottom surface of box part 2d is a lower slit 2b which is formed opposite and facing upper slit 2a. A reflector 8 is fixed on base part 2c located directly below lower slit 2b. The arrangement provides that the light emitted from lamp 4 irradiates the original A through upper slit 2a either directly or after being reflected from the flat reflector 5c. The light reflected from the original A passes through lower slit 2b and is reflected by reflector 8 and into exposure portion 13 (a detailed portrayal and description of exposure portion 13 is omitted). Lamp housing unit 2 is moved by a driving device (not shown) whereby the original A mounted on the contact glass 1 is irradiated by light from lamp 4 through upper slit 2a.

Further, in movably mounted box part 2d is an auxiliary exposure plate 6. The lower surface of plate 6 has a bright color (normally white) and plate 6 is disposed so as to be capable of movement along the lower surface of the top of box part 2d. Thus, part of upper slit 2a may be closed by moving auxiliary exposure plate 6 to the right (as the apparatus is shown in FIG. 1). Therefore, a part of the light emitted from the lamp 4 is reflected by the auxiliary exposure plate 6, rather than the original A, toward exposure portion 13. A rack 6a is formed on the lower surface of auxiliary exposure plate 6. Auxiliary exposure plate 6 is moved by motor 7 having pinion 7a which engages rack 6a. A control unit 11 comprising a CPU with a ROM containing the operating program as well as a mapping of insertion coverage of upper slit 2a by auxiliary exposure plate 6 based upon the range of input data affecting the reproduced image. Such data is obtained experimentally for recording sheets compatible with the image forming apparatus. A RAM for storing operating data provided control instructions to motor 7 is also provided.

An input unit 12 comprising a copy switch 12a, a photograph mode switch 12b, a tone change switch 12c, a magnification change switch 12d, and a photosensitive characteristic input switch 12e, is connected with the control unit 11.

An original support stand cover 9 for covering the contact glass 1 is installed on the image forming apparatus 10.

The operation of the described device will now be explained.

The copying operation is begun by placing the original A on the contact glass 1, closing the original support stand cover 9, and depressing copy switch 12a. Depression of copy switch 12a turns lamp 4 on and initiates movement of lamp housing unit 2 to the left, as portrayed in FIG. 1, along guide bar 3. During movement, the original A is irradiated by the light from lamp 4 through slit 2a. The omni-directional light emitted from lamp 4 is collected and reflected by the reflectors 5a, 5b and 5c to irradiate the original A by scanning the original A through upper slit 2a as lamp housing unit 2 moves leftward. The light reflected from original A exposes a photosensitive and pressure-sensitive sheet 14 in exposure portion 13 through the optical systems comprising reflector 8 and a lens (not shown). During exposure, the photosensitive and pressure-sensitive sheet 14 is moved at the same speed or synchronized with the scanning movement of the lamp housing unit 2. After the exposure is ended, that is slit 2a has transmitted the length of original A, the photosensitive and pressure-sensitive sheet 14 is passed through the developing and fixing processes in order to produce the copied image. A detailed explanation of those operations is omitted as such processes are known in the art.

Figure 2:
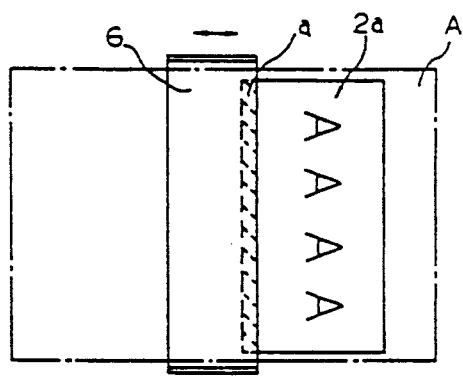
FIG. 2 is a view taken on line 2—2 of FIG. 1.

The just described operation is used for preparing an ordinary copy such as printed material. When it is necessary to reproduce tones or emphasize their tone reproduction, such as when copying a photograph, the user depresses the photograph mode switch 12b to activate the auxiliary exposure system. When activated, the motor 7 is controlled by the control unit 11 and the auxiliary exposure plate 6 is moved in the right, as seen in FIG. 1. When this happens, a part of auxiliary exposure plate 6 is inserted by a preset amount into the upper slit 2a thereby reducing its size. The preset amount of the insertion of auxiliary exposure plate 6 is usually set to approximately $\frac{1}{5}-\frac{1}{4}$ of the width of upper slit 2a (upper slit 2a is normally about 20 millimeters wide), but may be set to close off about $\frac{1}{2}$ of upper slit 20 at a maximum. Thus, auxiliary exposure plate 6 is moved to cover a part of upper slit 2a. As shown in FIG. 2, the photosensitive and pressure-sensitive sheet 14 is irradiated or exposed by light reflected from the original A mixed with light reflected from the reflection surface of the auxiliary exposure plate 6 (indicated by shaded portion a). The practical result on the photosensitive and pressuresensitive sheet 14 is the same as obtained by light radiated from a secondary light source to produce the auxiliary exposure.

In the described invention, the amount of upper slit 2a that auxiliary exposure plate 6 moves to cover is "factory" set. Alternatively, the amount of upper slit 2a that can be covered by auxiliary exposure plate 6 can be adjusted by use of a tone change switch 12c. By adjusting the degree of coverage of upper slit 2a, the level of tone reproduction can be freely adjusted so the tone of the copied image more closely corresponds to that of the original A. Provision of a tone change switch capability lessens the need for precise adjustment of auxiliary exposure plate 6 during manufacture.

Further, when image forming apparatus 10 is provided the capability of changing copy magnification, the size of the image of the original A projected to the exposure portion 13 by the lens in the optical system (not shown) can be changed and the movement speed of the lamp housing unit 2 can also be changed. In this case, the amount of coverage of upper slit 2a by auxiliary exposure plate 6 is changed according to the magnification set by magnification change switch 12d. That is, the amount of coverage of upper slit 2a may decrease as the size of the image of the original A becomes larger, thereby keeping constant the amount of light of the auxiliary exposure to be applied to the photosensitive and pressure-sensitive sheet 14.

Also, when the photosensitive characteristic input switch 12e for inputting a characteristic information concerning light sensitivity of the photosensitive and pressure-sensitive sheet 14 provided in the input unit 12 is used, the control unit 11 changes the amount of coverage of upper slit 2a by the auxiliary exposure plate 6 on the basis of the input photosensitive characteristic information.

When auxiliary exposure plate 6 completely covers upper slit 2a, it is possible to delete an unnecessary part of the original A and produce a corresponding white portion on the copied image. However, if the whole of the upper slit 2a is covered by the auxiliary exposure plate 6, a shadow might appear in the copied image at the boundary of the portion where the upper slit 2a was fully covered with auxiliary exposure plate 6 and the portion which was not fully covered. This shadow may be very pronounced on the photosensitive and pressure-sensitive sheet used in the full-color copying and having microcapsules containing chromogenic material such as cyanogen, magenta, and yellow coated on the support material surface. However, exposing the photosensitive and pressuresensitive microcapsule sheet while its movement is discontinued for 1-2 seconds and moving the auxiliary exposure plate 6 to cover the upper slit 2a during that time prevents formation of the shadow.

The auxiliary exposure device of this invention, of course, can be used not only for the monochrome image formation but also for color image formation.

Although the color of the reflection surface of the auxiliary exposure plate 6 is white in this discussion it is not required to be so. It may be adjusted according to the color temperature of lamp 4 and sensitivity characteristic information of the photosensitive and pressure-sensitive sheet if the color used possesses the necessary reflection efficiency such that it is possible to correct the tone of the image formed by the image forming apparatus.

What is claimed is:

1. An auxiliary exposure device for an image forming apparatus to form an image on a recording medium by moving an original and a light source relatively and irradiating the recording medium with light emitted from the light source and reflected from the original comprising:
    a reflection member insertable into and removable from a light path extending to the recording medium from the light source, wherein said reflection member has a reflection surface for reflecting the light emitted from the light source;
    driving means for driving said reflection member for insertion into or removal from the light path; and
    control means for controlling said drive means and adjusting the amount of insertion of said reflection member into the light path.

2. An auxiliary exposure device as claimed in claim 1, wherein the reflection surface of said reflection member has a bright color.

3. An auxiliary exposure device as claimed in claim 2, wherein said reflection surface is white.

4. An auxiliary exposure device as claimed in claim 1, further comprising tone setting means for setting the tone of the formed image, wherein said control means controls said driving means to change the amount of insertion of said reflection member into the light path according to the tone set by said tone setting means.

5. An auxiliary exposure device as claimed in claim 1, further comprising input means for inputting information concerning the photosensitive characteristics of the recording medium, wherein said control means changes the amount of insertion of said reflection member into the light path according to the information input by said input means.

6. An auxiliary exposure device as claimed in claim 1, further comprising magnification setting means for setting a magnification of the formed image, wherein said control means changes the amount of insertion of said reflection member into the light path according to the magnification set by said magnification setting means.

7. An auxiliary exposure device for an image forming apparatus for forming an image copy on a recording medium by moving an original image and a light source relative to one another and irradiating the recording medium with light emitted from the light source and reflected from the original image: comprising:
    a reflection member controllably insertable into a light path from the light source to the recording medium, a lower surface of said reflection member providing a reflection surface for light from the light source;
    drive means for inserting and withdrawing said reflection member from the light path;
    input means for inputting copying conditions; and
    a control means for controlling said drive means on the basis of information from said input means.

8. An auxiliary exposure device as claimed in claim 7, wherein said reflection surface is white.

9. An auxiliary exposure device as claimed in claim 7, wherein said input means comprises a mode switch for designating tone reproduction of an original image containing at least three distinct tones.

10. An auxiliary exposure device as claimed in claim 9, wherein depressing said mode switch initiates control of said drive means by said control means.

11. An auxiliary exposure device as claimed in claim 10, wherein initiating control of said drive means inserts said reflection member into the light path by a predetermined amount.

12. An auxiliary exposure device as claimed in claim 9, wherein said input means further comprises means for selecting tonal characteristics.

13. An auxiliary exposure device as claimed in claim 12, wherein said input means further comprises means for identifying light sensitivity characteristics of the recording medium.

14. An auxiliary exposure device as claimed in claim 13, wherein said input means further comprises a means for setting the size relationship between the original image and the image copy.

15. An auxiliary exposure device as claimed in claim 7, wherein said control means comprises:
- a central processing unit;
- a read only memory containing the control program; and
- a random access memory for storing information input through said input means.

16. An auxiliary exposure device for an image copying apparatus that forms a copy image in a recording medium by relatively moving an original image and a light source to irradiate the recording medium with light emitted from the light source and reflected from the original image, comprising:
- a reflection member having a reflection surface for reflecting light from the light source onto the recording medium, said reflection member controllably insertable into a light path from the light source to the recording material;
- a drive means for moving said reflection member into and from the light path;
- an input means for inputting data identifying tonal characteristics of the original image, light sensitivity of the recording medium and desired size of the image copy;
- a control means for controlling the amount of insertion of said reflection member into the light path based upon the data from said input means.

* * * * *

UNITED STATES PATENT AND TRADEMARK OFFICE
CERTIFICATE OF CORRECTION

PATENT NO. : 5,066,974
DATED : November 19, 1991
INVENTOR(S) : Takashi NAKATA and Tsuyoshi SUZUKI It is certified that error appears in the above-identified patent and that said Letters Patent is hereby corrected as shown below:

ON THE TITLE PAGE:

[75] change "Tauyoshi Suzuki" to -- Tsuyoshi Suzuki --

Signed and Sealed this

Second Day of March, 1993

*Attest:*

STEPHEN G. KUNIN

*Attesting Officer*      *Acting Commissioner of Patents and Trademarks*